(12) United States Patent
Ong et al.

(10) Patent No.: US 11,574,877 B2
(45) Date of Patent: Feb. 7, 2023

(54) SEMICONDUCTOR MINIATURIZATION THROUGH COMPONENT PLACEMENT ON STEPPED STIFFENER

(71) Applicant: Intel Corporation, Santa Clara, CA (US)

(72) Inventors: Jenny Shio Yin Ong, Pinang (MY);
Seok Ling Lim, Kulim Kedah (MY);
Bok Eng Cheah, Pinang (MY);
Jackson Chung Peng Kong, Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/088,606

(22) Filed: Nov. 4, 2020

(65) Prior Publication Data

US 2022/0068841 A1     Mar. 3, 2022

(30) Foreign Application Priority Data

Sep. 2, 2020   (MY) ............................. PI2020004533

(51) Int. Cl.
*H01L 23/00*    (2006.01)
*H01L 23/16*    (2006.01)
*H01L 21/48*    (2006.01)
*H01L 23/498*   (2006.01)

(52) U.S. Cl.
CPC ........ *H01L 23/562* (2013.01); *H01L 21/4853* (2013.01); *H01L 23/16* (2013.01); *H01L 23/49833* (2013.01); *H01L 23/49838* (2013.01)

(58) Field of Classification Search
CPC . H01L 23/562; H01L 23/16; H01L 23/49833; H01L 23/49838; H01L 21/4853
USPC ....................................... 257/730
See application file for complete search history.

(56) References Cited

U.S. PATENT DOCUMENTS

| 2003/0057550 A1* | 3/2003 | Zhao ................ H01L 23/49833 257/734 |
| 2015/0357269 A1* | 12/2015 | Im .................... H01L 23/49541 257/676 |
| 2020/0006246 A1 | 1/2020 | Kong et al. |

* cited by examiner

*Primary Examiner* — Quoc D Hoang
(74) *Attorney, Agent, or Firm* — Viering, Jentschura & Partner mbB

(57) ABSTRACT

According to various examples, a device is described. The device may include a stiffener member including a first step section and a second step section. The device may also include a plurality of vias extending from or through the stiffener member. The device may be coupled to a printed circuit board.

14 Claims, 9 Drawing Sheets

SEMICONDUCTOR MINIATURIZATION THROUGH COMPONENT PLACEMENT ON STEPPED STIFFENER

CROSS-REFERENCE TO RELATED APPLICATIONS

This non-provisional application claims priority to Malaysian Application No. PI2020004533, filed on Sep. 2, 2020, which is incorporated by reference herein in its entirety.

BACKGROUND

Voltage regulator (VR) components such as bulk capacitors, decoupling capacitors, inductors and MOSFET are foundational to enable high performance in a semiconductor system. However, these VR components consume sizable printed circuit board (PCB) real estate, posing huge challenges to platform miniaturizations.

The presence of a VR component may affect the electrical properties of the PCB traces, which is an important consideration as electronic components continue to increase in speed. As a design "rule of thumb", placing signal routings/traces immediately beneath the VR component in PCB is generally prohibited due to the significant noise coupling ascribed to the magnetic field (H-field) may lead to signal quality degradation, e.g., increased signaling jitter that may reduce signal transmission bandwidth. This restriction in the placement of signal routings may pose a significant challenge when seeking to aggressively reduce board size.

The existing solution to accommodate the ever-increasing VR component count includes PCB footprint expansion. Electrical signal routings are restricted to inner layers of PCB e.g., at least 3 layers apart from the surface layer or inductor components to avoid magnetic field coupling noises that could result in functionality failures. However, this results in the increased PCB footprint and layer count. This also inhibits device form-factor miniaturizations.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figures 1A, 1B:
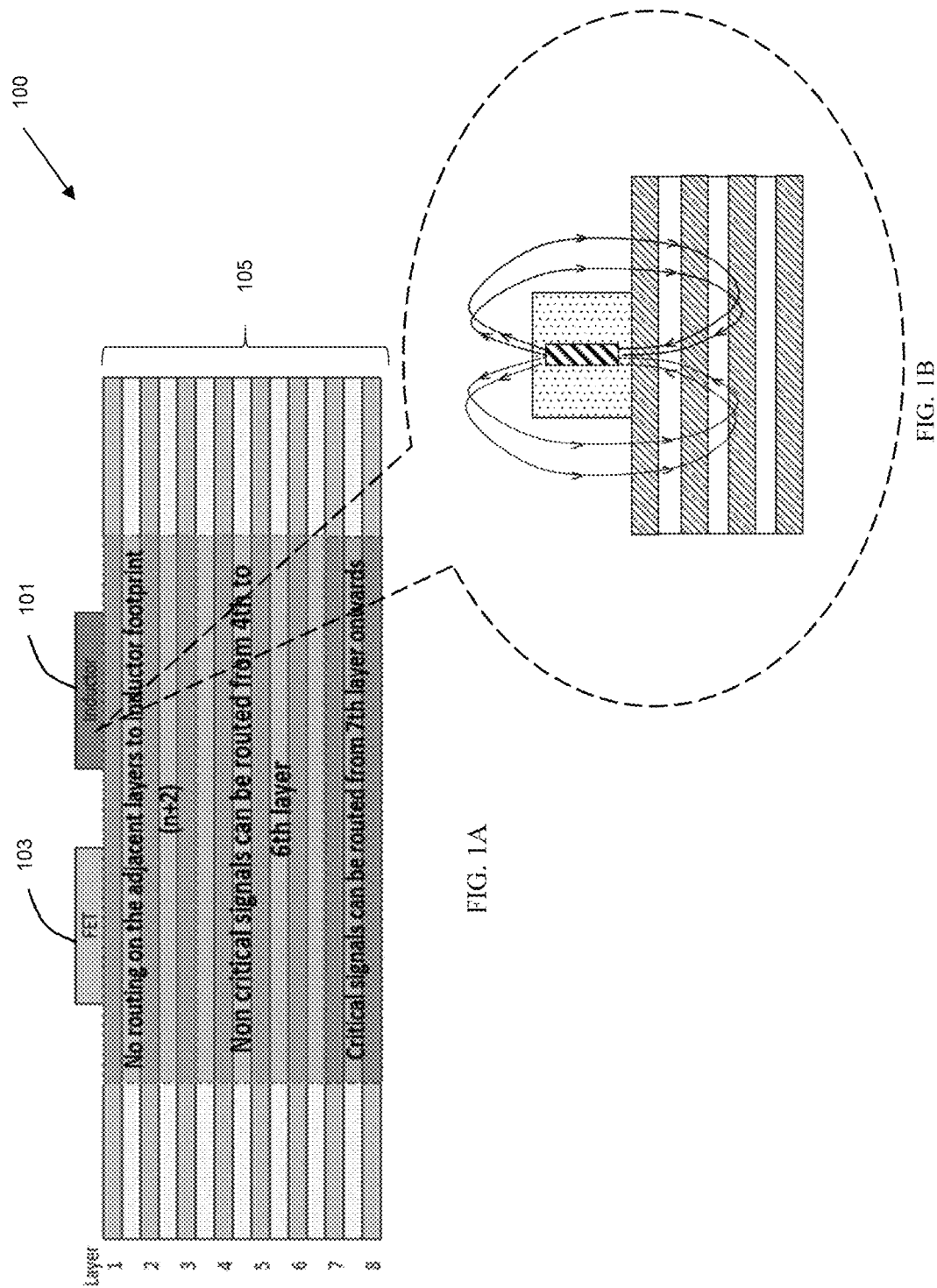
FIG. 1A shows an illustrative representation of a multi-layer circuit board with a semiconductor device and an inductor.
FIG. 1B shows an illustrative representation of the inductor's magnetic field according to the device shown in FIG. 1A.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for the present devices, and various aspects are provided for the methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include platform miniaturatization through package substrate and/or PCB real-estate reduction. Platform miniaturatization may be achieved by direct placement of power delivery components e.g., inductors, voltage regulators (VR) or capacitors on a stepped stiffener. Platform miniaturatization may be achieved by eliminating of the need for PCB routing in the keep-out-zone adjacent to inductor components. Platform miniaturatization may also be achieved by reduction of decoupling components through more direct or effective PCB to chiplet power delivery paths.

An advantage of the present disclosure may include improved signal integrity performance for high-speed multi-Gbps signals (>20 Gbps), such as for serializer/deserializer (SerDes), Thunderbolt (TBT), and peripheral component interconnect express (PCIe) signals without the electromagnetic (EM) interference from switching VR components especially for the multi-phase inductors and field-effect transistor (FET) power stages.

An advantage of the present disclosure may include enhanced power delivery performance through more direct or shorter power delivery network between passive devices and stacked chiplets which may result in reduced inductance loop between the passive devices and stacked chiplets.

These and other aforementioned advantages and features of the aspects herein disclosed will be apparent through reference to the following description and the accompanying drawings. Furthermore, it is to be understood that the features of the various aspects described herein are not mutually exclusive and can exist in various combinations and permutations.

The present disclosure generally relates to a device. The device may include a stiffener member including a first step section and a second step section. The device may also include a plurality of vias extending from or through the stiffener member. The device may be coupled to a printed circuit board.

The present disclosure generally relates to a method of forming a device. The device may be coupled to a printed circuit board. The method may include forming a stiffener member. The method may also include forming a plurality of vias extending from or through the stiffener member. The method may include forming a first step section and a second step section on the stiffener member.

The present disclosure generally relates to a computing device. The computing device may include a printed circuit board. The computing device may include a semiconductor package coupled to the printed circuit board including a stiffener member including a first step section and a second step section. The semiconductor package may include a plurality of vias extending from or through the stiffener member.

To more readily understand and put into practical effect, the present device, computing device, method, and other particular aspects will now be described by way of examples and not limitations, and with reference to the figures. For the sake of brevity, duplicate descriptions of features and properties may be omitted.

FIG. 1A shows an illustrative representation of a multi-layer circuit board with a semiconductor device and an inductor. FIG. 1B shows an illustrative representation of the inductor's magnetic field according to the device shown in FIG. 1A.

As shown in FIG. 1A, a typical semiconductor system 100 may have an inductor 101 and a semiconductor device 103 (e.g., a field effect transistor) positioned on a printed circuit board (PCB) 105 having several layers. For typical layout designs, there will be no signal routings/traces placed immediately beneath inductor components on the PCB (i.e., a "keep-out-zone") due to significant noise coupling ascribed to the magnetic field (also known as an H-field).

As illustrated in the view provided in FIG. 1B, the effects of an inductor's H-field may reach as far as the $3^{rd}$ layer of the PCB. The signal routings may need to be placed at the $4^{th}$ layer onwards and may still be limited to non-critical or low-speed signals (<1 Gbps). The critical signal routings (e.g., for clock signals and/or high-speed signals with data rate ≥10 Gbps) may need to be placed from the $7^{th}$ layer onwards, which may increase PCB and/or motherboard layer count and/or require additional PCB real estate to avoid the effects of the inductor's H-field.

Figure 2A:
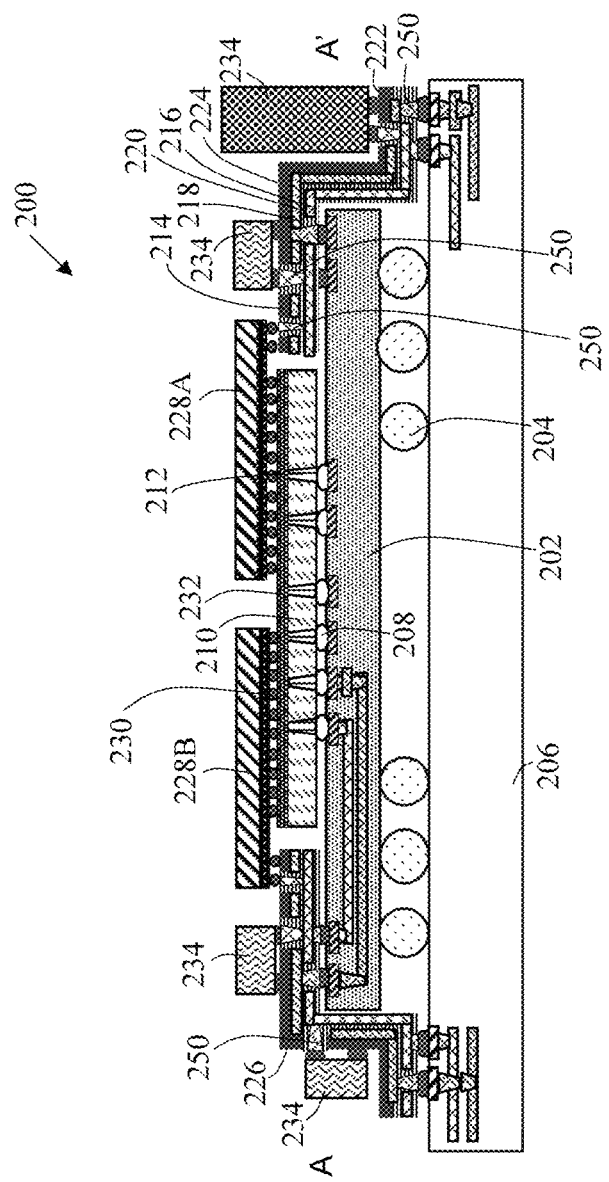
FIG. 2A shows a cross-sectional view of a semiconductor system according to an aspect of the present disclosure.
Figure 2B:
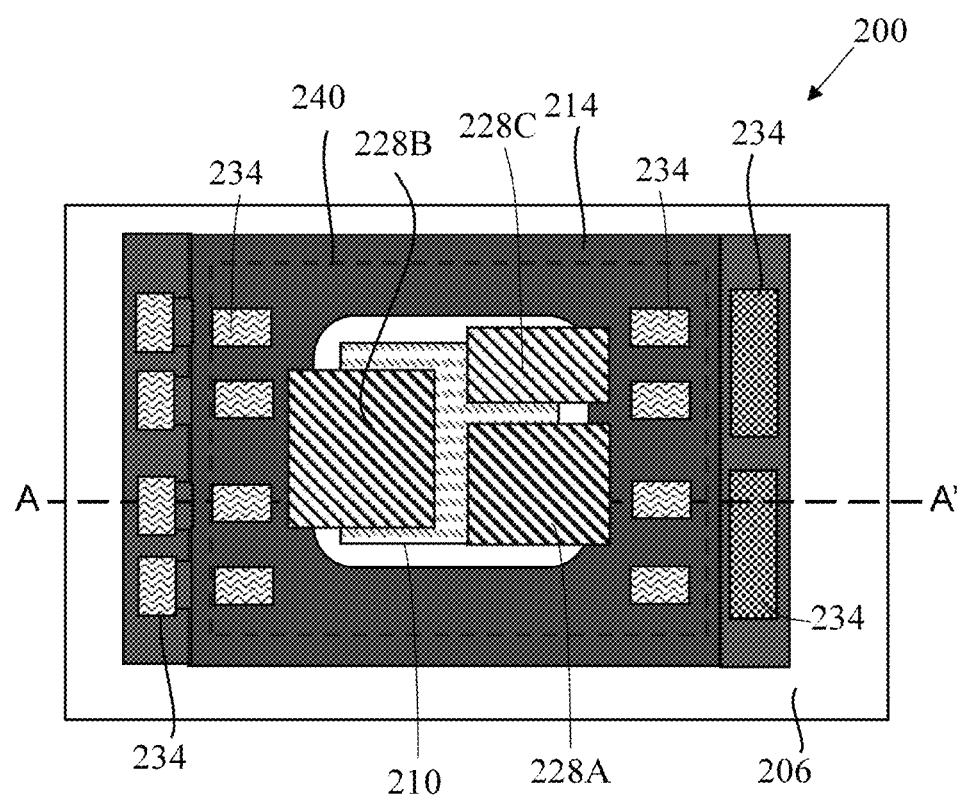
FIG. 2B shows a top view of the semiconductor system according to an aspect of the semiconductor system shown in FIG. 2A.

FIG. 2A shows a cross-sectional view of a semiconductor system according to an aspect of the present disclosure. FIG. 2B shows a top view of the semiconductor system according to an aspect of the semiconductor system shown in FIG. 2A.

In an aspect of the present disclosure, a semiconductor system 200 is shown in FIGS. 2A and 2B. The semiconductor system 200 may be a device. The semiconductor system 200 may include a semiconductor package, e.g., a stacked semiconductor package like a 2.5D or a 3D semiconductor package.

In an aspect of the present disclosure, the semiconductor system 200 may include a package substrate 202. The package substrate 202 may include contact pads, electrical interconnects, routings, and other features, which are not shown in any of the present figures. The package substrate 202 may have one or more rigid core layer for improved structural stability or a coreless substrate package for a reduced form-factor. In other aspects, the package substrate 202 may be part of a larger substrate that supports additional semiconductor packages, and/or components. In FIG. 2B, a package substrate footprint 240 is shown.

In an aspect of the present disclosure, the semiconductor system 200 may include a plurality of solder balls 204. The package substrate 202 may be connected to a motherboard 206 through the plurality of solder balls 204. The motherboard 206 may be a PCB. In an aspect, the plurality of solder balls 204 may provide an electrical connection between the package substrate 202, and the motherboard 206.

In an aspect of the present disclosure, the semiconductor system 200 may include a plurality of package bumps 208 disposed on the package substrate 202. The plurality of package bumps 208 may be controlled collapse chip connection (C4) bumps. In an aspect, an underfill layer may be deposited to cover, and to protect the plurality of package bumps 208 in a conventional manner. The underfill layer may be provided to improve the mechanical reliability of the package bumps 208 in the semiconductor system 200. The underfill layer may be provided using either a conventional underfilling process or no-flow underfilling process to reduce the effects of thermal expansion and reduce the stress and strain on the package bumps 208.

In an aspect of the present disclosure, the semiconductor system 200 may include an interposer 210. The interposer 210 may be an electrical routing interface between one connection to another. The purpose of the interposer 210 may be to redistribute a connection to a wider pitch or to reroute a connection to a different connection. The interposer 210 may be an active interposer (i.e. comprises one or more transceiver devices) or a passive interposer (i.e. without a transceiver device). The interposer 210 may be a silicon interposer, an organic interposer or a ceramic interposer.

In an aspect of the present disclosure, the interposer 210 may be disposed on the package substrate 202. In an aspect, the interposer 210 may be connected to the package substrate 202 through the plurality of package bumps 208. The plurality of package bumps 208 may also provide an electrical connection between the interposer 210, and the package substrate 202.

In an aspect of the present disclosure, the interposer 210 may include at least one through-silicon-via (TSV) 212. The plurality of package bumps 208 may provide an electrical connection between the at least one TSV 212, and the package substrate 202. Each TSV 212 may be correspondingly coupled to a package bump 208 of the plurality of package bumps 208.

In an aspect of the present disclosure, the semiconductor system 200 may include a stiffener member 214. In an aspect, the stiffener member 214 may be or may include a metal frame, e.g., a conductive metal frame such as stainless-steel frame or a conductive aluminum frame. In another aspect, the stiffener member 214 may include an organic frame e.g., a non-conductive frame such as an epoxy polymer mold frame or a silicone frame.

In an aspect of the present disclosure, the stiffener member 214 may have a plurality of vias 250 extending from and/or through the stiffener member 214. In an aspect, the stiffener member 214 may have a first surface and a second surface. The plurality of vias 250 may extend from the second surface of the stiffener member 214. The plurality of vias 250 may extend from the first surface and through the second surface of the stiffener member 214.

In an aspect of the present disclosure, the semiconductor system 200 may include at least one metallization layer. The at least one metallization layer may be on the second surface of the stiffener member 214. In an aspect, the at least one metallization layer may include a power (Vcc) reference plane 216. The at least one metallization layer may also include a ground (Vss) reference plane 218. In an aspect, the Vcc reference plane 216, and the Vss reference plane 218 may be separated by a dielectric layer 220.

In an aspect of the present disclosure, the Vss reference plane 218 may be disposed on the second surface of the stiffener member 214, followed by the dielectric layer 220, and the Vcc reference plane 216. In other words, the Vss reference plane 218 may be the closest to the second surface of the stiffener member 214, and the Vcc reference plane 216 may be the farthest from the second surface of the stiffener member 214.

In an aspect of the present disclosure, the layers of the Vss reference plane 218, dielectric layer 220, and the Vcc reference plane 216 may be repeated and customized according to the power delivery design requirements of the semiconductor system.

In an aspect of the present disclosure, the dielectric layer 220 may be disposed on the second surface of the stiffener member 214, followed by the Vcc reference plane 216. In other words, there may not be a Vss reference plane 218 between the stiffener member 214 and the dielectric layer 220. In this aspect, the stiffener member 214 may be configured to be or to have properties of a Vss reference plane 218. This may result in the reduction of the number of metallization layers required on the second surface of the stiffener member 214.

In an aspect of the present disclosure, the plurality of vias 250 extending from and/or through the stiffener member 214 may be electrically connected to the at least one metallization layers. The plurality of vias 250 may extend through the metallization layers.

In an aspect of the present disclosure, the stiffener member 214 may be a stepped stiffener member. In an aspect, the stiffener member 214 may include a first step section 222. In an aspect, the first step section 222 of the stiffener member 214 may be coupled to the motherboard 206. The first step section 222 may be coupled to the motherboard 206 though solder interconnects.

In an aspect of the present disclosure, the stiffener member 214 may include a second step section 224. In an aspect, the second step section 224 of the stiffener member 214 may be coupled to the package substrate 202. The second step section 224 may be coupled to the package substrate 202 though solder interconnects. The second step section 224 may be adjacent to the interposer 210.

In an aspect of the present disclosure, the stiffener member 214 may include an intermedial section 226 between the first step section 222 and the second step section 224 of the stiffener member 214. The intermedial section 226 may be a vertical section. The intermedial section 226 may be perpendicular to the first step section 222 and the second step section 224.

In an aspect of the present disclosure, the semiconductor system 200 may include at least one passive device 234 such as a VR or VR components, e.g., capacitors or inductors. The at least one passive device 234 may be disposed on the first surface of the stiffener member 214. In an aspect, the at least one passive device 234 may be disposed on at least one of the first step section 222, the second step section 224, and the intermedial section 226. In an aspect, since the first step section 222 is couple to the motherboard 206, it may be preferred that the VR is disposed on the first step section 222, while smaller VR components are disposed on the second step section 224, or the intermedial section 226. However, depending on semiconductor device requirements, a VR may be placed in other locations on the stiffener member 214, and a VR component may be placed on the first step section 222. In an aspect, one or more signal conductors may be routed adjacent to a surface of the motherboard 206 with the VR component e.g., one or more inductors being placed further away from the motherboard 206 and isolated by the stiffener member 214 and the metallization layers.

In an aspect of the present disclosure, the semiconductor system 200 may include at least one semiconductor device 228. In an aspect, the at least one semiconductor device 228 may be made from any suitable semiconductor, such as silicon or gallium arsenide. The semiconductor device 228 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIGS. 2A and 2B, the at least one semiconductor device 228 may be a set of chiplets, which may include a first semiconductor device 228A, a second semiconductor device 228B, and a third semiconductor device 228C.

In an aspect of the present disclosure, the at least one semiconductor device 228 may be disposed on or at least partially disposed on the interposer 210. The at least one semiconductor device 228 may also be at least partially disposed on the second step section 224 of the stiffener member 214.

In an aspect of the present disclosure, a plurality of solder bumps 230 may be disposed on the interposer 210. The plurality of solder bumps 230 may provide an electrical connection between the at least one semiconductor device 228, and the at least one TSV 212 along with a redistribution layer (RDL) 232. In an aspect, the at least one TSV 212 may be configured to transmit signals between the package substrate 202 and the semiconductor device 228. In an aspect of the present disclosure, at least a portion of the semiconductor device 228 may be electrically coupled to the package substrate 202 through the at least one TSV 212.

In an aspect of the present disclosure, the plurality of solder bumps 230 may be disposed on the second step section 224 of the stiffener member 214. The plurality of solder bumps 230 may provide an electrical connection between the plurality of metallization layers and the at least one semiconductor device 228.

In an aspect of the present disclosure, the semiconductor device 228 which may include the first semiconductor device 228A, the second semiconductor device 228B, and the third semiconductor device 228C may communicate with one another through the RDL 232 within the interposer 210. In an aspect, the RDL 232 may include a plurality of conductive traces interleaving with a plurality of dielectric layers. In further aspects, the RDL 232 is coupled to the at least one TSV 212 within the interposer 210.

In an aspect of the present disclosure, the plurality of vias 250 extending from and/or through the stiffener member 214 may electrically connect the passive device 234 to the motherboard 206 or the package substrate 202. In an aspect, the passive device 234 may be electrically connected to the intermedial section 226 of the stiffener member 214 through a solder layer. In an aspect, at least a portion of the semiconductor device 228 may be electrically connected to the passive device 234 on the first step section 222, the second step section 224 or the intermedial section 226 through the plurality of vias 250 and the metallization layers.

Figure 3:
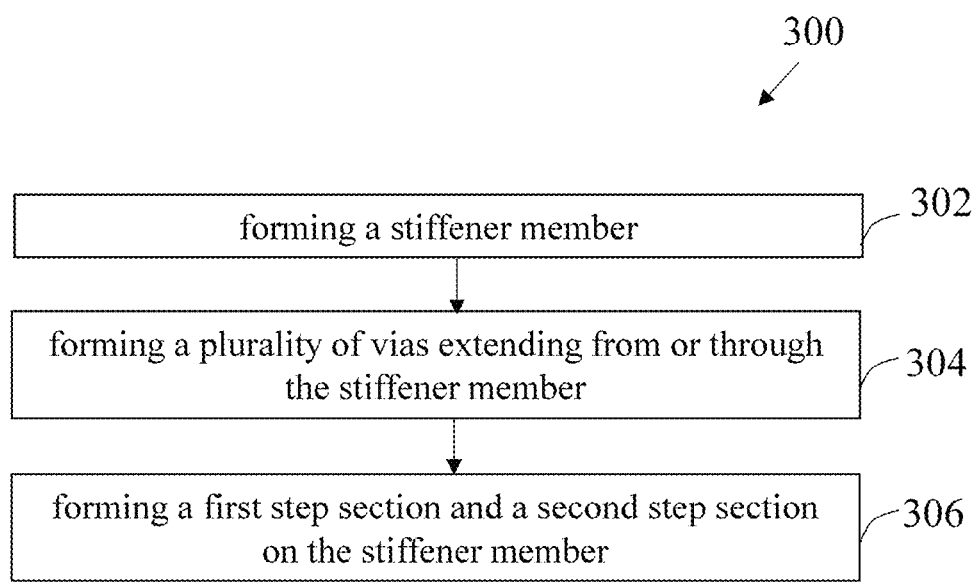
FIG. 3 shows a flow chart illustrating a method of forming a semiconductor system according to an aspect of the present disclosure.

FIG. 3 shows a flow chart illustrating a method of forming a semiconductor system according to an aspect of the present disclosure.

As shown in FIG. 3, there may be a method 300 of forming a device. The device may be coupled to a printed circuit board. In the method 300, a first operation 302 may include forming a stiffener member. A second operation 304 may include forming a plurality of vias extending from or through the stiffener member. A third operation 306 may include forming a first step section and a second step section on the stiffener member.

It will be understood that the above operations described above relating to FIG. 3 are not limited to this particular order. Any suitable, modified order of operations may be used.

Figure 4A:
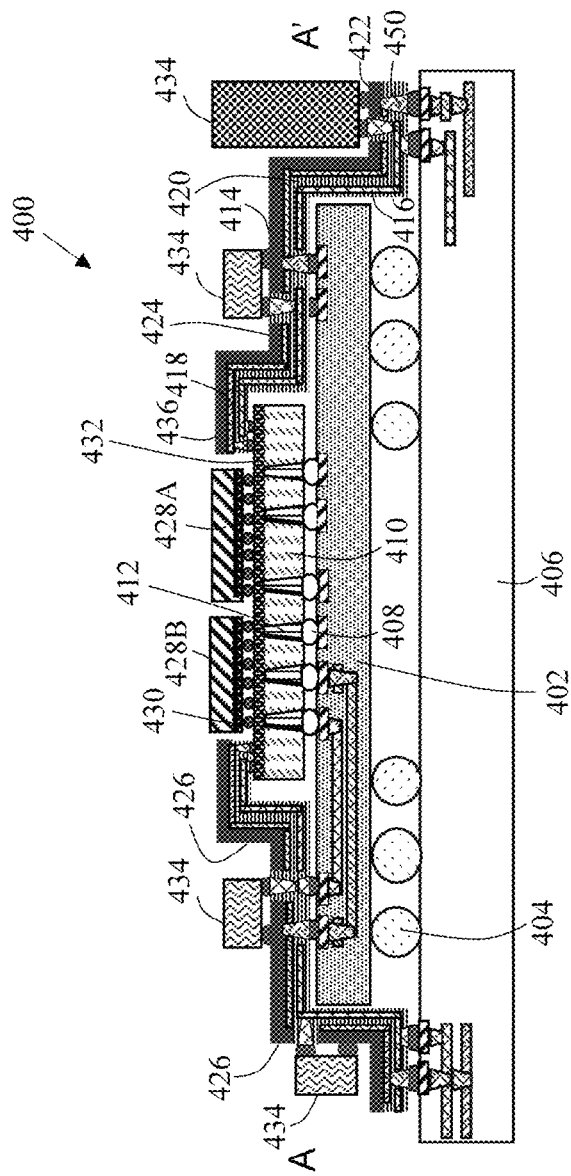
FIG. 4A shows a cross-sectional view of a semiconductor system according to an aspect of the present disclosure.
Figure 4B:
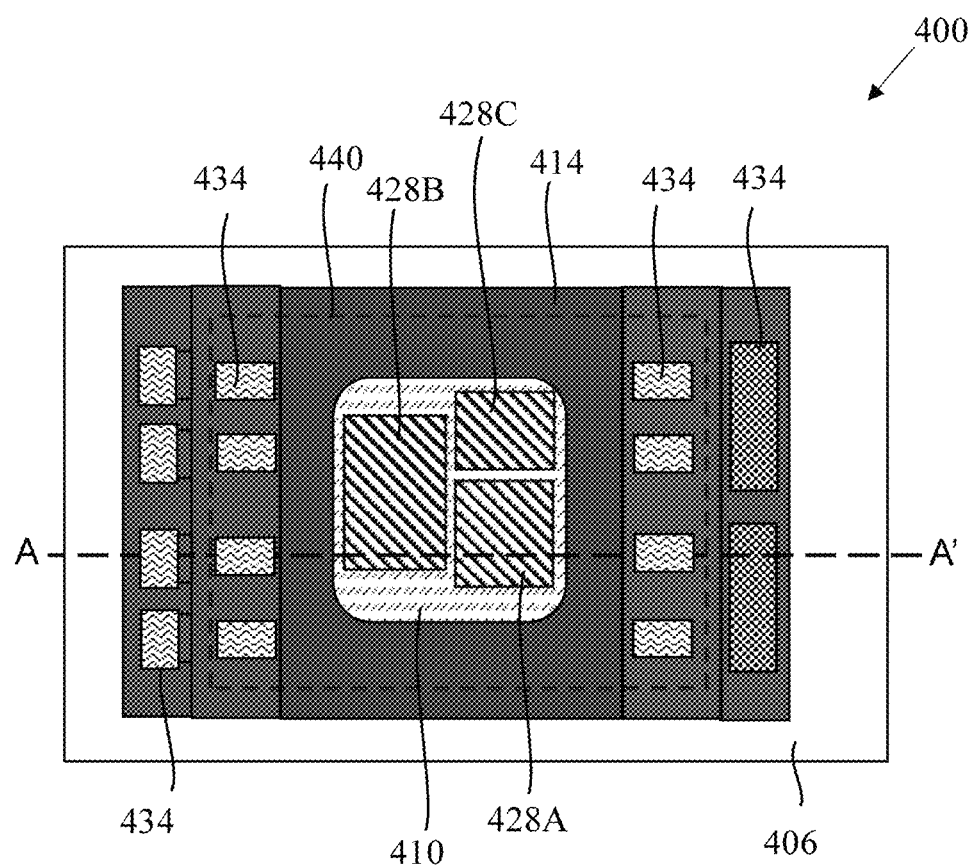
FIG. 4B shows a top view of the semiconductor system according to an aspect of the semiconductor system shown in FIG. 4A.

FIG. 4A shows a cross-sectional view of a semiconductor system according to an aspect of the present disclosure. FIG. 4B shows a top view of the semiconductor system according to an aspect of the semiconductor system shown in FIG. 4A.

In an aspect of the present disclosure, a semiconductor system 400 is shown in FIGS. 4A and 4B. The semiconductor system 400 may be a device. The semiconductor system 400 may include a semiconductor package, e.g., a stacked semiconductor package like a 2.5D or a 3D semiconductor package.

In an aspect of the present disclosure, the semiconductor system 400 may include a package substrate 402. The package substrate 402 may include contact pads, electrical interconnects, routings, and other features, which are not shown in any of the present figures. The package substrate 402 may have one or more rigid core layer for improved structural stability or a coreless substrate package for a reduced form-factor. In other aspects, the package substrate 402 may be part of a larger substrate that supports additional semiconductor packages, and/or components. In FIG. 4B, a package substrate footprint 440 is shown.

In an aspect of the present disclosure, the semiconductor system 400 may include a plurality of solder balls 404. The package substrate 402 may be connected to a motherboard 406 through the plurality of solder balls 404. The motherboard 406 may be a PCB. In an aspect, the plurality of solder balls 404 may provide an electrical connection between the package substrate 402, and the motherboard 406.

In an aspect of the present disclosure, the semiconductor system 400 may include a plurality of package bumps 408 disposed on the package substrate 402. The plurality of package bumps 408 may be controlled collapse chip connection (C4) bumps. In an aspect, an underfill layer may be deposited to cover, and to protect the plurality of package bumps 408 in a conventional manner. The underfill layer may be provided to improve the mechanical reliability of the package bumps 408 in the semiconductor system 400. The underfill layer may be provided using either a conventional underfilling process or no-flow underfilling process to reduce the effects of thermal expansion and reduce the stress and strain on the package bumps 408.

In an aspect of the present disclosure, the semiconductor system 400 may include an interposer 410. The interposer 410 may be an electrical routing interface between one connection to another. The purpose of the interposer 410 may be to redistribute a connection to a wider pitch or to reroute a connection to a different connection. The interposer 410 may be an active interposer (i.e. comprises one or more transceiver devices) or a passive interposer (i.e. without a transceiver device). The interposer 410 may be a silicon interposer, an organic interposer or a ceramic interposer.

In an aspect of the present disclosure, the interposer 410 may be disposed on the package substrate 402. In an aspect, the interposer 410 may be connected to the package substrate 402 through the plurality of package bumps 408. The plurality of package bumps 408 may also provide an electrical connection between the interposer 410, and the package substrate 402.

In an aspect of the present disclosure, the interposer 410 may include at least one TSV 412. The plurality of package bumps 408 may provide an electrical connection between the at least one TSV 412, and the package substrate 402. Each TSV 412 may be correspondingly coupled to a package bump 408 of the plurality of package bumps 408.

In an aspect of the present disclosure, the semiconductor system 400 may include a stiffener member 414. In an aspect, the stiffener member 414 may be or may include a metal frame, e.g., a conductive metal frame such as stainless-steel frame or a conductive aluminum frame. In another aspect, the stiffener member 414 may include an organic frame e.g., a non-conductive frame such as an epoxy polymer mold frame or a silicone frame.

In an aspect of the present disclosure, the stiffener member 414 may have a plurality of vias 450 extending from and/or through the stiffener member 414. In an aspect, the stiffener member 414 may have a first surface and a second surface. The plurality of vias 450 may extend from the second surface of the stiffener member 414. The plurality of vias 450 may extend from the first surface and through the second surface of the stiffener member 414.

In an aspect of the present disclosure, the semiconductor system 400 may include at least one metallization layer. The at least one metallization layer may be on the second surface of the stiffener member 414. In an aspect, the at least one metallization layer may include a power (Vcc) reference plane 416. The at least one metallization layer may also include a ground (Vss) reference plane 418. In an aspect, the Vcc reference plane 416, and the Vss reference plane 418 may be separated by a dielectric layer 420.

In an aspect of the present disclosure, the Vss reference plane 418 may be disposed on the second surface of the stiffener member 414, followed by the dielectric layer 420, and the Vcc reference plane 416. In other words, the Vss reference plane 418 may be the closest to the second surface of the stiffener member 414, and the Vcc reference plane 416 may be the farthest from the second surface of the stiffener member 414.

In an aspect of the present disclosure, the layers of the Vss reference plane 418, dielectric layer 420, and the Vcc reference plane 416 may be repeated and customized according to the power delivery design requirements of the semiconductor system.

In an aspect of the present disclosure, the dielectric layer 420 may be disposed on the second surface of the stiffener member 414, followed by the Vcc reference plane 416. In other words, there may not be a Vss reference plane 418 between the stiffener member 414 and the dielectric layer 420. In this aspect, the stiffener member 414 may be configured to be or to have properties of a Vss reference plane 418. This may result in the reduction of the number of metallization layers required on the second surface of the stiffener member 414.

In an aspect of the present disclosure, the plurality of vias 450 extending from and/or through the stiffener member 414 may be electrically connected to the at least one metallization layers. The plurality of vias 450 may extend through the metallization layers.

In an aspect of the present disclosure, the stiffener member 414 may be a stepped stiffener member. In an aspect, the stiffener member 414 may include a first step section 422. In an aspect, the first step section 422 of the stiffener member 414 may be coupled to the motherboard 406. The first step section 422 may be coupled to the motherboard 406 though solder interconnects.

In an aspect of the present disclosure, the stiffener member 414 may include a second step section 424. In an aspect, the second step section 424 of the stiffener member 414 may be coupled to the package substrate 402. The second step section 424 may be coupled to the package substrate 402 though solder interconnects. The second step section 424 may be adjacent to the interposer 410.

In an aspect of the present disclosure, the stiffener member 414 may include a third step section 436. In an aspect, the third step section 436 of the stiffener member 414 may be coupled to the interposer 410. The third step section 436 may be adjacent to the semiconductor device 428A or 428B.

In an aspect of the present disclosure, the stiffener member 414 may include an intermedial section 426 between the first step section 422 and the second step section 424 of the stiffener member 414 or between the second step section 424 and the third step section 436 of the stiffener member 414. The intermedial section 426 may be a vertical section. The intermedial section 426 may be perpendicular to the first step section 422 and the second step section 424. The intermedial section 426 may be perpendicular to the second step section 424 and the third step section 436.

In an aspect of the present disclosure, the semiconductor system 400 may include at least one passive device 434 such as a VR or VR components, e.g., capacitors or inductors. The at least one passive device 434 may be disposed on the first surface of the stiffener member 414. In an aspect, the at least one passive device 434 may be disposed on at least one of the first step section 422, the second step section 424, the third step section 436 and the intermedial section 426. In an aspect, since the first step section 422 is couple to the motherboard 406, it may be preferred that the VR is disposed on the first step section 422, while smaller VR components are disposed on the second step section 424, the third step section 436 or the intermedial section 426. However, depending on semiconductor device requirements, a VR may be placed in other locations on the stiffener member 414, and a VR component may be placed on the first step section 422. In an aspect, one or more signal conductors may be routed adjacent to a surface of the motherboard 406 with the VR component e.g., one or more inductors being placed further away from the motherboard 406 and isolated by the stiffener member 414 and the metallization layers.

In an aspect of the present disclosure, the semiconductor system 400 may include at least one semiconductor device 428. In an aspect, the at least one semiconductor device 428 may be made from any suitable semiconductor, such as silicon or gallium arsenide. The semiconductor device 428 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIGS. 4A and 4B, the at least one semiconductor device 428 may be a set of chiplets, which may include a first semiconductor device 428A, a second semiconductor device 428B, and a third semiconductor device 428C.

In an aspect of the present disclosure, the at least one semiconductor device 428 may be disposed on the interposer 410.

In an aspect of the present disclosure, a plurality of solder bumps 430 may be disposed on the interposer 410. The plurality of solder bumps 430 may provide an electrical connection between the at least one semiconductor device 428, and the at least one TSV 412 along with a redistribution layer (RDL) 432. In an aspect, the at least one TSV 412 may be configured to transmit signals between the package substrate 402 and the semiconductor device 428. In an aspect of the present disclosure, the semiconductor device 428 may be electrically coupled to the package substrate 402 through the at least one TSV 412.

In an aspect of the present disclosure, the third step section 436 of the stiffener member 414 may be electrically coupled to the interposer 410 by the plurality of solder bumps 430.

In an aspect of the present disclosure, the semiconductor device 428 which may include the first semiconductor device 428A, the second semiconductor device 428B, and the third semiconductor device 428C may communicate with one another through the RDL 432 within the interposer 410. In an aspect, the RDL 432 may include a plurality of conductive traces interleaving with a plurality of dielectric layers. In further aspects, the RDL 432 is coupled to the at least one TSV 412 within the interposer 410. In an aspect, the RDL 432 may provide an electrical connection between the plurality of metallization layers on the second surface of the third step section 436, and the at least one semiconductor device 428.

In an aspect of the present disclosure, the plurality of vias 450 extending from and/or through the stiffener member 414 may electrically connect the passive device 432 to the motherboard 406 or the package substrate 402. In an aspect, the passive device 434 may be electrically connected to the intermedial section 426 of the stiffener member 414 through a solder layer. In an aspect, at least a portion of the semiconductor device 428 may be electrically connected to the passive device 434 on the first step section 422, the second step section 424 or the intermedial section 426 through the plurality of vias 450 and the metallization layers.

FIGS. 5A through 5F show cross-sectional views directed to an exemplary process flow for a method of forming a semiconductor system according to an aspect of the present disclosure.

Figure 5A:
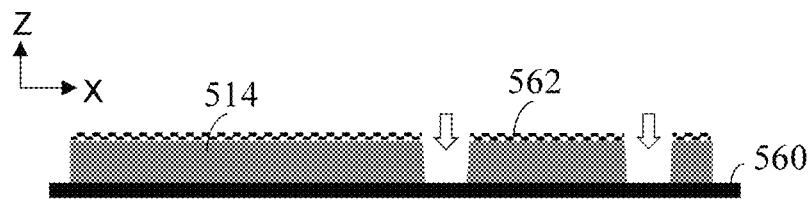
FIGS. 5A through 5F show cross-sectional views directed to an exemplary process flow for a method of forming a semiconductor system according to an aspect of the present disclosure.

As shown in FIG. 5A, a stiffener member 514 with a metal foil 562 may be disposed on a carrier 560. The metal foil 562 may be disposed on the stiffener member 514 through a hot-press lamination or an electroplating process. The stiffener member 514 may be disposed on the carrier 560 through an adhesion or a lamination process. A plurality of via openings may be formed in the stiffener member 514 using an etching, a mechanical drilling and/or laser drilling process.

Figure 5B:
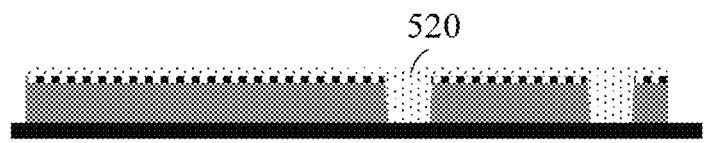

As shown in FIG. 5B, a dielectric layer 520 may be deposited in the plurality of via openings using a lamination and/or a centrifugal spin coating process.

Figure 5C:
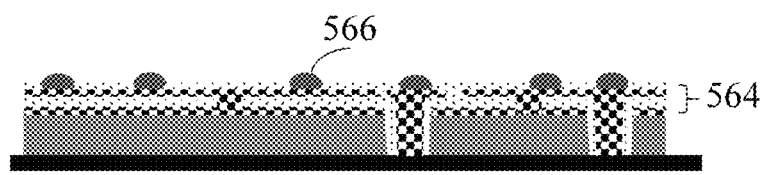

As shown in FIG. 5C, a plurality of metallization layers 564 may be formed on the stiffener member 514, in between the dielectric layer 520 using electroplating, photolithography and/or an etching process. Solder interconnects 566 may be disposed on the plurality of metallization layers 564.

Figure 5D:
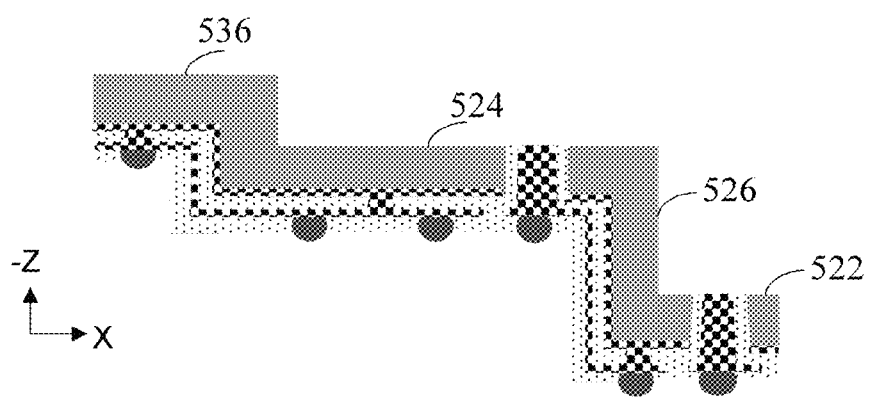

As shown in FIG. 5D, the structure of FIG. 5C may be flipped over, and may undergo mechanical stamping process to form a stepped stiffener member. The stepped stiffener member may include a first step section 522, a second step section 524, a third step section 536, and a intermedial section 526.

Figure 5E:
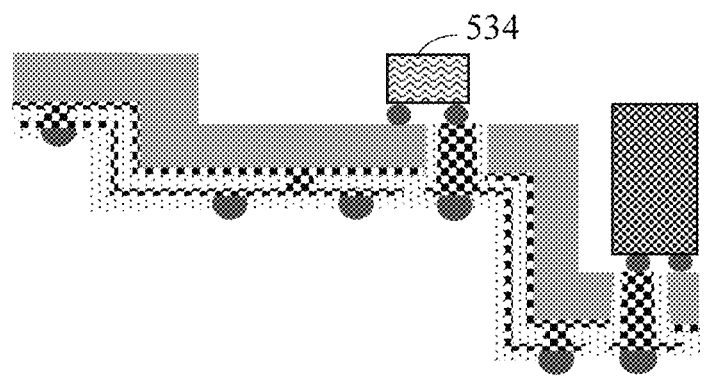

As shown in FIG. 5E, at least one passive device 534 may be disposed on the stiffener member 514. The passive devices 534 may be disposed on the first step section 522, and/or the second step section 524.

Figure 5F:
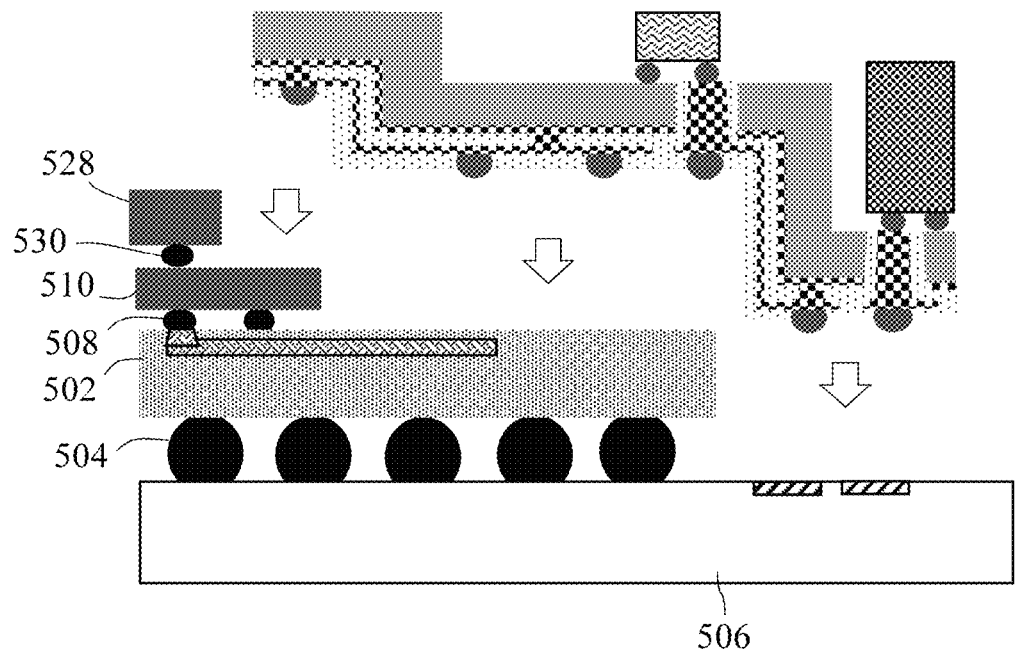

As shown in FIG. 5F, a package substrate 502 may be disposed on a motherboard 506 by solder balls 504. An interposer 510 may be disposed on the package substrate 502 by package bumps 508. A semiconductor device 528 may be disposed on the package substrate 502 by solder bumps 530. The structure of FIG. 5E may be deposed on the motherboard 506, the package substrate 502, and the interposer 510. The first step section 522 may be on the motherboard 506. The second step section 524 may be on the package substrate 502. The third step section 536 may be on the interposer 510.

It will be understood that the exemplary process described above relating to FIGS. 5A through 5F are not limited to this particular order. Any suitable, modified order of operations may be used.

Aspects of the present disclosure may be implemented into a system using any suitable hardware and/or software.

Figure 6:
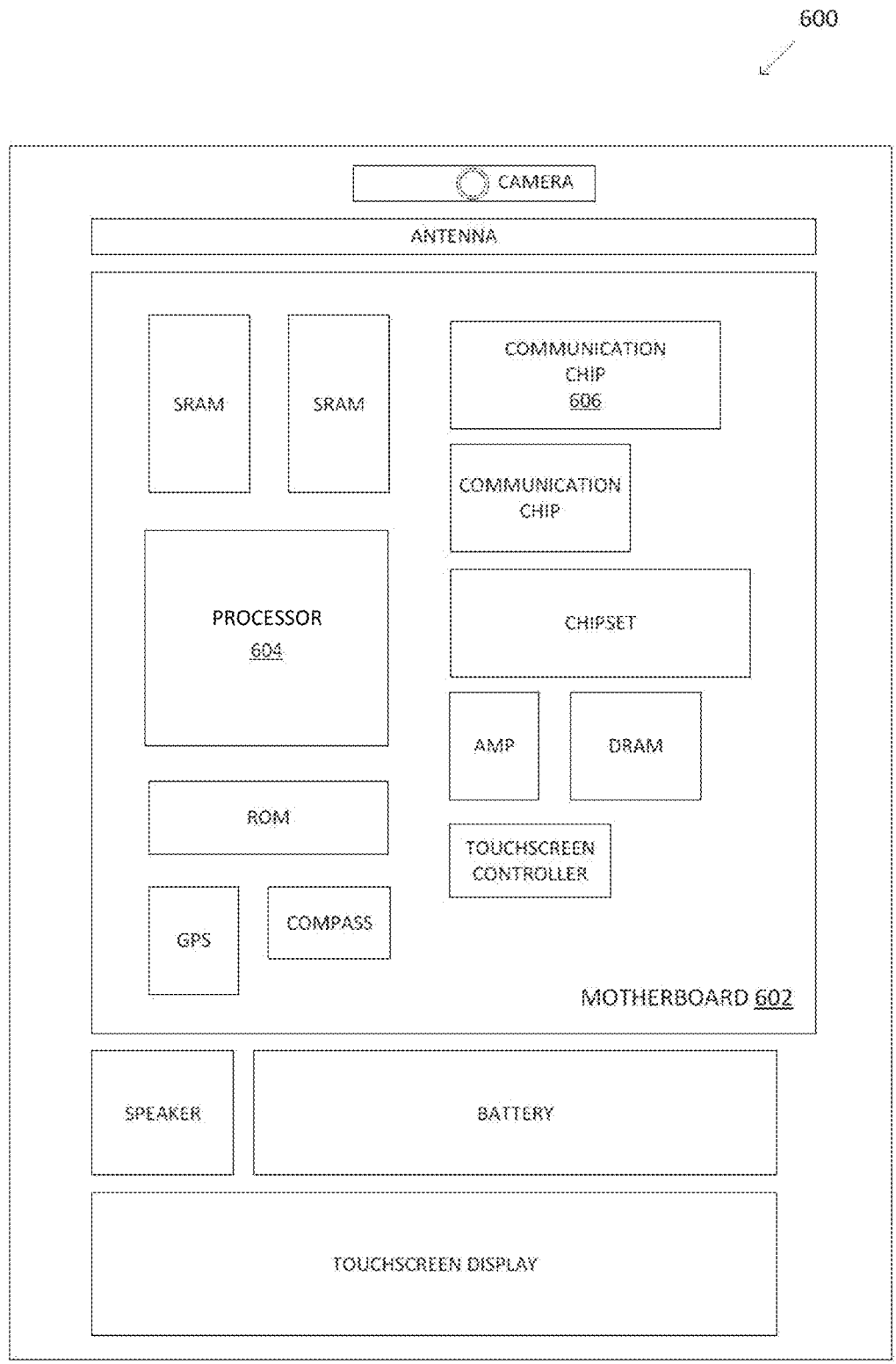
FIG. 6 shows an illustration of a computing device that includes a semiconductor system according to a further aspect of the present disclosure.

FIG. 6 schematically illustrates a computing device 600 that may include a semiconductor system as described herein, in accordance with some aspects.

As shown in FIG. 6, the computing device 600 may house a board such as a motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 604 of the computing device 600 may be packaged in a semiconductor package, as described herein, and/or other semiconductor devices may be packaged together in a semiconductor package as described herein.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 606 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 606 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other aspects.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 600 may be a mobile computing device. In further implementations, the computing device 600 may be any other electronic device that processes data.

EXAMPLES

Example 1 may include a device including a stiffener member including a first step section and a second step section; and a plurality of vias extending from or through the stiffener member, wherein the device is coupled to a printed circuit board.

Example 2 may include the device of example 1 and/or any other example disclosed herein in which the stiffener member further includes a first surface and a second surface; and at least one metallization layer on the second surface of the stiffener member.

Example 3 may include the device of example 2 and/or any other example disclosed herein in which the first step section of the stiffener member is coupled to the printed circuit board and the second step section is coupled to a package substrate coupled to the printed circuit board.

Example 4 may include the device of example 3 and/or any other example disclosed herein in which the stiffener member further includes an intermedial section between the first step section and the second step section of the stiffener member.

Example 5 may include the device of example 4 and/or any other example disclosed herein in which the device further includes at least one passive device on the first surface of the stiffener member, wherein the at least one passive device is on at least one of the first step section, the second step section, or the intermedial section of the stiffener member.

Example 6 may include the device of example 2 and/or any other example disclosed herein in which the device further includes one or more semiconductor device is at least partially disposed on an interposer, and at least partially disposed on the first surface of the second step section.

Example 7 may include the device of example 3 and/or any other example disclosed herein in which the stiffener member further includes a third step section coupled to an interposer coupled to the package substrate.

Example 8 may include the device of example 7 and/or any other example disclosed herein in which the device further includes one or more semiconductor device disposed on the interposer; and wherein the one or more semiconductor device is coupled to the third step section of the stiffener member through a redistribution layer on the interposer.

Example 9 may include the device of example 2 and/or any other example disclosed herein in which the at least one metallization layer includes a power reference plane disposed on the second surface of the stiffener member with a dielectric layer between the power reference plane and the stiffener member.

Example 10 may include the device of example 9 and/or any other example disclosed herein in which the at least one metallization layer further includes a ground reference plane disposed on the second surface of the stiffener member between the dielectric layer and the stiffener member.

Example 11 may include a method including forming a stiffener member; forming a plurality of vias extending from or through the stiffener member; forming a first step section and a second step section on the stiffener member, wherein the device is coupled to a printed circuit board.

Example 12 may include the method of example 11 and/or any other example disclosed herein in which the stiffener member includes a first surface and a second surface, the method further including forming at least one metallization layer on the second surface of the stiffener member.

Example 13 may include the method of example 12 and/or any other example disclosed herein in which the method further includes coupling the first step section of the stiffener member to the printed circuit board; and coupling the second step section to a package substrate coupled to the printed circuit board.

Example 14 may include the method of example 13 and/or any other example disclosed herein in which forming the stiffener member further includes forming an intermedial section between the first step section and the second step section of the stiffener member.

Example 15 may include the method of example 14 and/or any other example disclosed herein in which the method further includes positioning at least one passive device on the first surface of the stiffener member, wherein the at least one passive device is on at least one of the first step section, the second step section, or the intermedial section of the stiffener member.

Example 16 may include the method of example 12 and/or any other example disclosed herein in which the method further includes disposing one or more semiconductor device at least partially on an interposer and at least partially on the first surface of the second step section.

Example 17 may include the method of example 13 and/or any other example disclosed herein in which forming the stiffener member further includes forming a third step section of the stiffener member; and coupling the third step section to an interposer coupled to the package substrate.

Example 18 may include the method of example 17 and/or any other example disclosed herein in which the method further includes disposing one or more semiconductor device on an interposer; and coupling the one or more semiconductor device to the third step section of the stiffener member through a redistribution layer on the interposer.

Example 19 may include a computing device including a printed circuit board; and a device coupled to the printed circuit board including a stiffener member including a first step section and a second step section; and a plurality of vias extending from or through the stiffener member.

Example 20 may include the computing device of example 19 and/or any other example disclosed herein in which the first step section of the stiffener member is coupled to the printed circuit board and the second step section is coupled to a package substrate coupled to the printed circuit board.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific system or device may also hold for any system or device described herein. It will also be understood that any property described herein for a specific method may hold for any of the methods described herein. Furthermore, it will be understood that for any device, system, or method described herein, not necessarily all the components or operations described will be enclosed in the device, system, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   a stiffener member comprising a first step section and a second step section; and
   a plurality of vias extending from or through the stiffener member, wherein the device is coupled to a printed circuit board;
   wherein the stiffener member further comprises a first surface and a second surface; and
   further comprising at least one metallization layer on the second surface of the stiffener member;
   wherein the first step section of the stiffener member is coupled to the printed circuit board and the second step section is coupled to a package substrate coupled to the printed circuit board; and wherein the at least one metallization layer comprises a power reference plane disposed on the second surface of the stiffener member with a dielectric layer between the power reference plane and the stiffener member.

2. The device of claim 1, wherein the stiffener member further comprises an intermedial section between the first step section and the second step section of the stiffener member.

3. The device of claim 2, further comprising:
at least one passive device on the first surface of the stiffener member, wherein the at least one passive device is on at least one of the first step section, the second step section, or the intermedial section of the stiffener member.

4. The device of claim 1, further comprising:
one or more semiconductor devices at least partially disposed on an interposer, and at least partially disposed on the first surface of the second step section.

5. The device of claim 1, wherein the stiffener member further comprises a third step section coupled to an interposer coupled to the package substrate.

6. The device of claim 5, further comprising:
one or more semiconductor devices disposed on the interposer; and
wherein the one or more semiconductor devices are coupled to the third step section of the stiffener member through a redistribution layer on the interposer.

7. The device of claim 1, wherein the at least one metallization layer further comprises a ground reference plane disposed on the second surface of the stiffener member between the dielectric layer and the stiffener member.

8. A method of forming a device, comprising:
forming a stiffener member;
forming a plurality of vias extending from or through the stiffener member;
forming a first step section and a second step section on the stiffener member, wherein the device is coupled to a printed circuit board;
wherein the stiffener member comprises a first surface and a second surface, the method further comprising:
forming at least one metallization layer on the second surface of the stiffener member; and
coupling the first step section of the stiffener member to the printed circuit board;
coupling the second step section to a package substrate coupled to the printed circuit board; and
wherein forming the at least one metallization layer comprises forming a power reference plane disposed on the second surface of the stiffener member with a dielectric layer between the power reference plane and the stiffener member.

9. The method of claim 8, wherein forming the stiffener member further comprises forming an intermedial section between the first step section and the second step section of the stiffener member.

10. The method of claim 9, further comprising:
positioning at least one passive device on the first surface of the stiffener member, wherein the at least one passive device is on at least one of the first step section, the second step section, or the intermedial section of the stiffener member.

11. The method of claim 8, further comprising:
disposing one or more semiconductor devices at least partially on an interposer and at least partially on the first surface of the second step section.

12. The method of claim 8, wherein forming the stiffener member further comprises:
forming a third step section of the stiffener member; and
coupling the third step section to an interposer coupled to the package substrate.

13. The method of claim 12, further comprising:
disposing one or more semiconductor devices on an interposer; and
coupling the one or more semiconductor devices to the third step section of the stiffener member through a redistribution layer on the interposer.

14. A computing device comprising:
a printed circuit board; and
a device coupled to the printed circuit board comprising:
a stiffener member comprising a first step section and a second step section; and
a plurality of vias extending from or through the stiffener member;
wherein the first step section of the stiffener member is coupled to the printed circuit board and the second step section is coupled to a package substrate coupled to the printed circuit board;
further comprising at least one metallization layer on the second surface of the stiffener member, wherein the at least one metallization layer comprises a power reference plane disposed on the second surface of the stiffener member with a dielectric layer between the power reference plane and the stiffener member.

* * * * *